United States Patent [19]

Shirai

[11] Patent Number: 4,992,839
[45] Date of Patent: Feb. 12, 1991

[54] FIELD EFFECT THIN FILM TRANSISTOR HAVING A SEMICONDUCTOR LAYER FORMED FROM A POLYCRYSTAL SILICON FILM CONTAINING HYDROGEN ATOM AND HALOGEN ATOM AND PROCESS FOR THE PREPARATION OF THE SAME

[75] Inventor: Shigeru Shirai, Nagahama, Japan

[73] Assignee: Canon Kabushiki Kaisha, Tokyo, Japan

[21] Appl. No.: 171,862

[22] Filed: Mar. 22, 1988

[30] Foreign Application Priority Data

Mar. 23, 1987 [JP] Japan .................................. 62-68305
Mar. 24, 1987 [JP] Japan .................................. 62-69776

[51] Int. Cl.$^5$ ..................... H01L 27/01; H01L 27/13; H01L 29/78; H01L 45/00
[52] U.S. Cl. ..................... 357/23.7; 357/2; 437/84; 437/87
[58] Field of Search ..................... 357/23.7, 2; 437/84, 437/87

[56] References Cited

U.S. PATENT DOCUMENTS 4,217,347 8/1980 Ovshinsky et al. ..................... 357/2
4,441,973 4/1984 Noguchi ..................... 357/2

FOREIGN PATENT DOCUMENTS 59-65479   4/1984 Japan ..................... 357/23.7
59-207828 11/1984 Japan ..................... 357/23.7
63-119575  5/1988 Japan ..................... 357/23.7
64-000766  1/1989 Japan ..................... 357/23.7

OTHER PUBLICATIONS

Kamins et al., "Hydrogenation of Transistors Fabricated in Polycrystalline-Silicon Film," IEEE Electron Device Lett., Aug. 1980, pp. 159–161.

Primary Examiner—Andrew J. James
Assistant Examiner—Daniel Y. J. Kim
Attorney, Agent, or Firm—Fitzpatrick, Cella, Harper & Scinto

[57] ABSTRACT

An improved field effect thin film transistor characterized in that the semiconductor layer being formed from a polycrystal silicon film: said layer containing at least hydrogen atom and fluorine atom except silicon atom layer: and the concentration of said hydrogen atom or said fluorine atom being distributed in the thickness direction in the state that it being relatively thick in a layer region in the side of the substrate and relatively thin in a layer region in the opposite side. A process for preparing the above field effect thin film transistor, characterized in that the semiconductor layer is formed by:

(a) providing a gaseous active species A generated from a compound (i) containing silicon atom and halogen atom by subjecting said compound (i) to the action of an activation energy in an active species A generation chamber and a gaseous active species B generated from a compound (ii) containing at least hydrogen atom by subjecting said compound (ii) to the action of an activation energy in an active species B generation space;

(b) introducing said active species A, said active species B and one or more of $H_2$ gas and $F_2$ gas into a film forming space having a substrate being maintained with a desired temperature; and (c) applying an excitation light energy into said film forming space to thereby cause chemical reactions among materials resulting in forming a polycrystal silicon film to be the semiconductor layer.

1 Claim, 8 Drawing Sheets

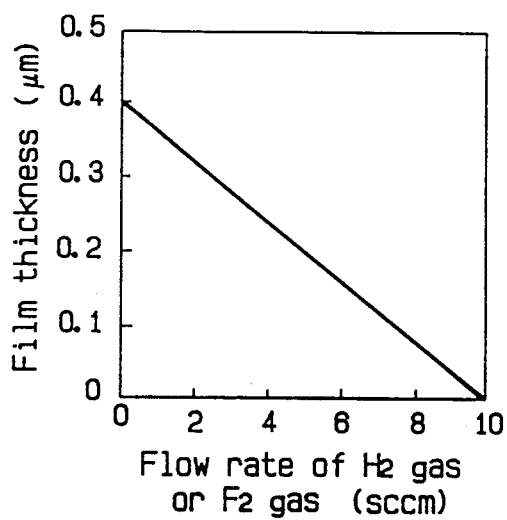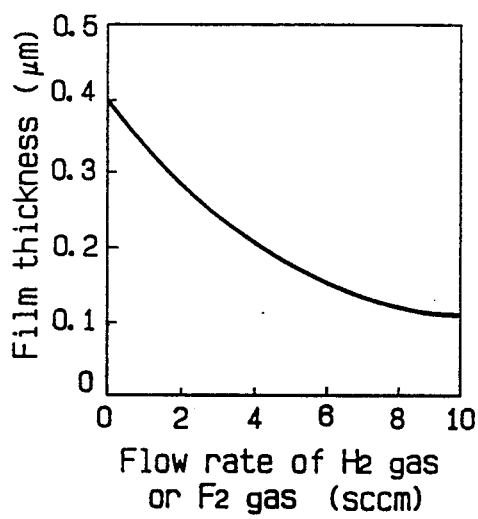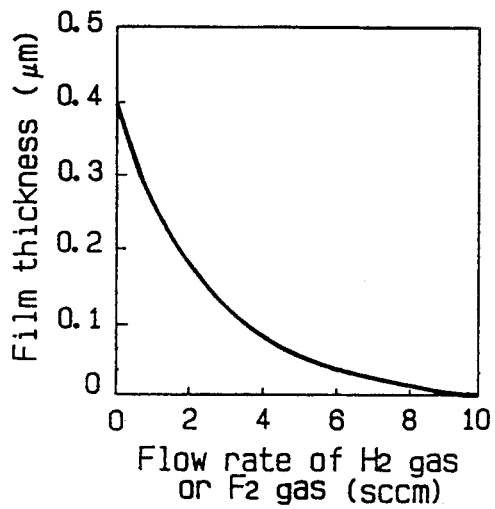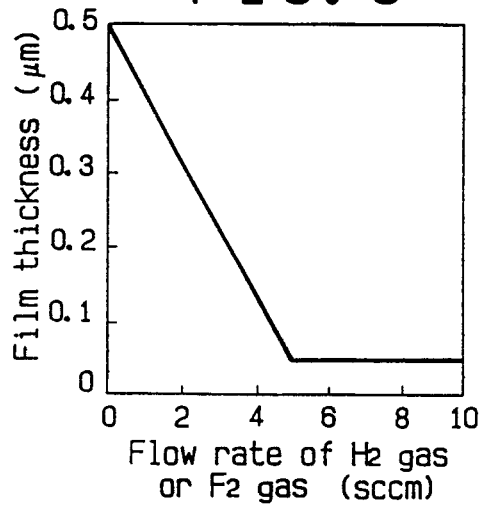

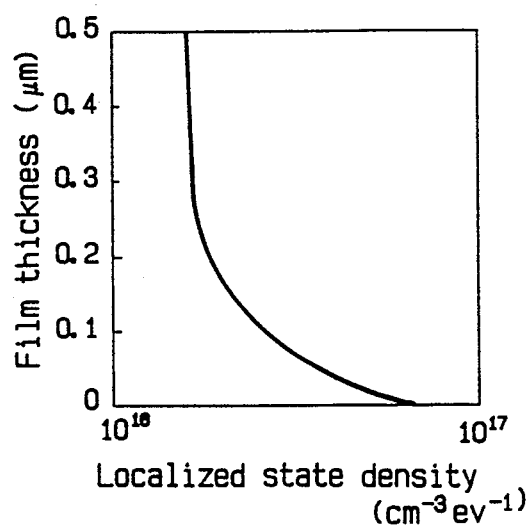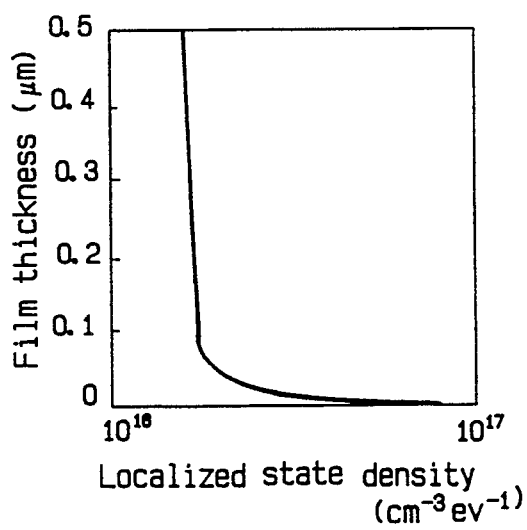

FIELD EFFECT THIN FILM TRANSISTOR HAVING A SEMICONDUCTOR LAYER FORMED FROM A POLYCRYSTAL SILICON FILM CONTAINING HYDROGEN ATOM AND HALOGEN ATOM AND PROCESS FOR THE PREPARATION OF THE SAME

FIELD OF THE INVENTION

This invention relates to an improved field effect thin film transistor having a semiconductor layer formed from a polycrystal silicon film containing at least hydrogen atom and halogen atom in the states of being distributed in the thickness direction.

BACKGROUND OF THE INVENTION

There have been made a number of proposals to use a silicon thin film as a constituent element in scanning circuits of image-reading devices such as lengthy unidimensional photosensor, large sized two-dimensional photosensor, etc., or in operation circuits of image-display devices using liquid crystal (LC), electroluminescent cell (EL) or electrochromic material (EC). Various studies have been made on hydrogenated amorphous silicon thin films or polycrystal silicon thin films to be used as such silicon thin film.

However, as for such known amorphous silicon thin film, there are problems that its effective electric carrier mobility ($\mu$ eff) is a small value of about 0.1 cm$^2$/V.sec. On the other hand, the $\mu$ eff, which is demanded for the constituent layer element in the scanning circuit or the operation circuit of recently developed high-speed and high functional image-reading device or image-display device, is 50 to 100 cm$^2$/V.sec.

There are problems also for such known polycrystal silicon thin film that although its $\mu$ eff is rather large compared to that of said amorphous silicon thin film, it is still insufficient, and in addition to this, it is difficult to obtain a large size polycrystal silicon film of uniform quality. As one of the reasons for this, there is present a localized state density of about $10^{18}$ cm$^{-3}$ at the grain boundary. When there is present such defect for the polycrystal silicon thin film, there will occur problems as mentioned below.

That is, (a) such state density at the grain boundary hinders the formation of a channel to cause heightening in the threshold voltage, and (b) such state density also hinders electric carriers to be transported and causes decrease in the field effect mobility.

In order to eliminate the problems relating to the foregoing polycrystal silicon thin film, there have been proposed a method of subjecting the resultant polycrystal silicon thin film to hydrogen plasma treatment to decrease such state density, and another method of subjecting the resultant polycrystal silicon thin film to laser annealing or electron beam annealing to widen the sizes of grains therein thereby decreasing the existing grain boundaries, as disclosed in IEEE Electron Device Letters, vol. EDL-1, No. 8, p. 159 (Aug. 1980). However, any of such proposed methods is not sufficient for solving the foregoing problems. That is, in the case of the above hydrogen plasma treatment, it is difficult to sufficiently decrease such state density at the grain boundary. And in the case of the laser annealing and in the case of the electron beam annealing, there are problems that it is difficult to eliminate an undesired influence caused by the surface state. It is also difficult to form a large size polycrystal silicon thin film having uniform characteristics in the case of preparing a large size thin film transistor.

Other than the above proposals, there has been proposed a method of forming a polycrystal silicon thin film while maintaining a substrate at relatively low temperature by way of associating or reacting different radicals in vapor phase as disclosed in Japanese Patent Unexamined Publication No. Sho. 62-40717. According to this proposed method, it is possible to incorporate hydrogen atom into a film while it being formed, and because of this, the defect of the grain boundary may be compensated with said hydrogen atom.

However, even for this method, there are problems that the hydrogen atoms as incorporated cause an increase in the stress in a film being formed and because of this, there often occurs peeling-off of a film during the film forming process.

In view of the above, it was difficult to immobilize a semiconductor device using a non-single-crystal silicon thin film as the constituent element layer in the past.

SUMMARY OF THE INVENTION

The present inventor has conducted extensive studies in order to solve the problems in the known semiconductor devices having a polycrystal silicon thin film as the constituent element semiconductor layer and in order to develop a desired semiconductor device using an improved polycrystal silicon thin film.

As a result, the present inventor has finally found a desirable polycrystal silicon thin film which is suited for use in the driving circuit of image-reading photosensor, image-display device, etc., and which makes it possible to immobilize a thin film semiconductor device.

It is therefore an object of this invention to provide an improved field effect thin film transistor (hereinafter referred to as "FE-TFT") having a desirable polycrystal silicon thin film as its constituent element semiconductor layer which has a high electric field mobility, and which is usable in various uses.

Another object of this invention is to provide an improved FE-TFT having a polycrystal silicon semiconductor layer which has a wealth of many practically applicable electric characteristics and which excels in the adhesion with other constituent layers.

A further object of this invention is to provide a process for the preparation of the foregoing FE-TFT in accordance with the simplified procedures detailed below.

BRIEF DESCRIPTION OF THE DRAWINGS

FIG. 3, FIG. 4, FIG. 5, FIG. 6, FIG. 7 and FIG. 8 are flow variation curves of H$_2$ gas or F$_2$ gas to be employed in the formation of polycrystal silicon films according to the process of this invention.

FIG. 20 and FIG. 21 are distribution curves of a localized state density in polycrystal silicon films formed according to the process of this invention, wherein both $H_2$ gas and $F_2$ gas are together used.

DESCRIPTION OF THE INVENTION

Figure 1:
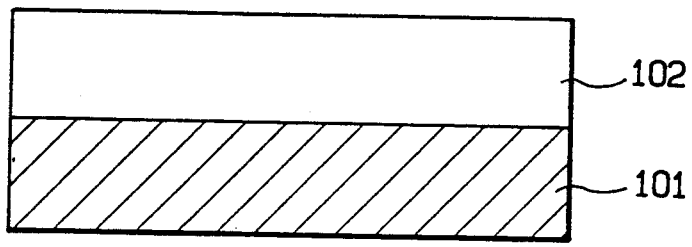
FIG. 1 is a schematic explanatory cross-sectional view of a polycrystal silicon film to be formed according to the process of this invention.

This invention has been accomplished based on the below-mentioned findings obtained as a result of extensive studies by the present inventor in order to attain the foregoing objects.

According to one aspect of this invention, there is provided a FE-TFT having an improved semiconductor layer formed from a polycrystal silicon film containing hydrogen atoms and fluorine atoms in layer regions near the polycrystal silicon grain boundaries and in the state that the hydrogen atoms or the fluorine atoms or the both atoms being distributed in the thickness direction.

According to another aspect of this invention, there is provided for the preparation of said FE-TFT.

As disclosed in U.S. Pat. No. 4,217,374, there is known that in case of a polycrystal silicon film formed in accordance with a conventional method, there are present a number of dangling bonds which cause undesired influences on carrier transportation. When such dangling bonds are compensated with hydrogen atoms or fluorine atoms, it becomes possible to eliminate the above problem and as a result, the resulting polycrystal silicon film will have improved electric characteristics. However, for this known process, there exist unsolved problems. That is, in the case where a hydrogen atom or fluorine atom is incorporated into a polycrystal silicon film to be formed in the film forming process, when an excessive amount of the hydrogen atom or the fluorine atom is incorporated into a polycrystal silicon film being formed, the stress in said polycrystal silicon film will gradually increase, and as a result, there will often occur problems such that the resulting film peels off or crystal growth to bring about said film is hindered. In addition to this, the crystallinities of a polycrystal silicon material to be formed at the beginning stage and that at the later stage of the film forming process will be different. Because of this, the localized density which will be present in the grain boundary of the resulting polycrystal, silicon film will become accordingly different.

It is known that the bonding energy between silicon atom and fluorine atom is larger than that between silicon atom and hydrogen atom. Because of this, undesired influences caused by the incorporation of fluorine atom on the electric characteristics and the heat resistance of the resulting polycrystal silicon film are rather small in comparison with the incorporating hydrogen atom.

However, there is a problem that where an excessive amount of fluorine atom is incorporated into a polycrystal silicon film to be formed, as above described, the stress of the film will increase to thereby hinder the crystal growth of a polycrystal silicon material to a polycrystal silicon film.

This situation is often found in the case of forming a polycrystal silicon film in accordance with a conventional film deposition method such as chemical vapor deposition method, low pressure chemical vapor deposition method and plasma chemical vapor deposition method.

Therefore, this invention is chiefly aimed at providing a desirable polycrystal silicon film free from the foregoing problems and which is effectively usable as a constituent semiconductor layer in various semiconductor devices.

This invention is further aimed at providing an improved FE-TFT having a desirable semiconductor layer formed from a polycrystal silicon film capable of effectively exhibiting electric characteristics desired therefor and having a sufficient adhesive property.

As a result of repeating experiments, the present inventor has found various facts. That is, when both hydrogen atom and fluorine atom are incorporated into a polycrystal silicon film to be formed and the distribution concentration of one or more of said atoms in the thickness direction is so made as to be thick in the layer region in the substrate side and thin in the opposite layer region, the resulting polycrystal silicon film has a slight localized density, excels in crystallinity and has a wealth of many practically applicable semiconductor characteristics. And the resultant polycrystal silicon film is suitable for use as a semiconductor layer in various semiconductor devices. Further, when a FE-TFT is prepared using said polycrystal silicon film as its semiconductor layer, it is immobilized as a practically usable FE-TFT which stably and continuously exhibits electric characteristics desired for FE-TFT even upon repeated use for a long period of time.

This invention has been accomplished based on the above findings. The FE-TFT to be provided according this invention is characterized in that the semiconductor layer is formed from a polycrystal silicon film: said layer contains at least hydrogen atom (H) and fluorine atom (F) other than silicon atom (Si); and the concentration of the hydrogen atom (H), the concentration of the fluorine atom (F) or the concentrations of the two atoms are distributed in the thickness direction in the state of being relatively thick in the layer region in the side of a substrate and relatively thin in the opposite layer region.

As for the amount of said hydrogen atom (H) and that of said fluorine atom (F) to be contained in the foregoing polycrystal silicon film, they should be properly determined having due regards to the proportion of grain boundaries to be contained in a polycrystal silicon film to be formed. However, in any case, it is important to adjust them to be such that any undesired influences are not caused on the electric characteristics, the crystallinity and the surface property of the resulting polycrystal silicon film.

In view of the above, the present inventor has experimentally confirmed that when they are adjusted to the values as below mentioned, the resulting polycrystal silicon film becomes suited for use as the semiconductor layer of a FE-TFT according to this invention.

That is, as for the concentration of the hydrogen atom (H) in the entire layer region, that is, the quantitative proportion of the H versus the sum of the quantity of the Si, that of the H and that of the F, it is preferably $1 \times 10^{-1}$ atomic ratio or less, and most preferably, $5 \times 10^{-2}$ atomic ratio or less. And its lower limit is preferably $5 \times 10^{-6}$ atomic ratio or more, and most preferably, $5 \times 10^{-5}$ atomic ratio or more.

Likewise as for the concentration of the fluorine atom (F) in the entire layer region, it is preferably $5 \times 10^{-2}$ atomic ratio or less, and most preferably, $1 \times 10^{-2}$ atomic ratio or less. Its lower limit is preferably $1 \times 10^{-6}$ atomic ratio or more, and most preferably, $1 \times 10^{-5}$ atomic ratio or more.

In the case where the concentration of the hydrogen atom (H) and that of the fluorine atom (F) in the entire layer region are so adjusted as above mentioned, hydrogen atom and fluorine atom become segregated in grain boundaries to sufficiently compensate localized states, and as a result, the resulting polycrystal silicon film becomes a desirable one.

However, even in the case where the concentration of the hydrogen atom (H) in the entire layer region is adjusted to such as above mentioned, there will be sometimes such occasion that the resulting polycrystal silicon film has insufficient electric characteristics depending upon its bonding state with the silicon atom (Si). That is, in the case where the number of Si—$H_2$ bonds are relatively large in comparison with the number of Si—H bonds, microvacancies are likely to be generated in the film, that results in hindering the crystallinity and decreasing the carrier mobility.

In order to avoid occurrence of this problem, the present inventor has experimentally confirmed that for the polycrystal silicon film to constitute the semiconductor layer of a FE-TFT according to this invention it is necessary to be such that meets the following condition in addition to the above conditions relating to the hydrogen atom (H) and the fluorine atom (F). That is, the polycrystal silicon film is such that as for the peaks in infrared absorption spectrum concerning Si—H bond and Si—$H_2$ bond, the ratio of the peak concerning the Si—H bond in 2000 cm$^{-1}$ to the peak concerning the Si—$H_2$ bond in 2100 cm$^{-1}$ is 1 or less.

Explanation now will be made about the procedures to form a desirable polycrystal silicon film to constitute the semiconductor layer of the FE-TFT according to this invention.

As a method of incorporating hydrogen atom and fluorine atom into a polycrystal silicon film in the desired state as above described, there may be illustrated a method of subjecting the previously formed polycrystal silicon film to heat-treatment in a gaseous plasma atmosphere containing hydrogen atom and fluorine atom as the main constituents.

In an example of this method, using a known hydrogen radical assisted CVD apparatus (hereinafter referred to as "HR-CVD apparatus"), there is firstly formed a polycrystal silicon film on a substrate in accordance with a known HR-CVD method. And said film is heat-treated in a gaseous plasma atmosphere, which will be formed in the following way. That is, $H_2$ gas and $F_2$ gas, further if necessary an inert gas such as Ar, He or Ne are introduced into the deposition chamber to form a gaseous plasma, for example, under the following conditions;

| | |
|---|---|
| substrate temperature: | 100 to 500° C. |
| inner pressure: | $10^{-5}$ to 10 Torr |
| high frequency power: | $10^{-3}$ to 10 W/m$_2$ |
| (50 to 5 GHz) | |

By treating the polycrystal silicon film in this way, hydrogen atom and fluorine atom are effectively incorporated thereinto.

Thereafter, in order to widen the size of a grain in the film and also in order to adjust the concentration of hydrogen atom and the concentration of fluorine atom in the resultant polycrystal silicon film annealing is carried out with the use of ruby laser or excimer laser. In this case, said polycrystal silicon film is annealed to a depth of about 100 Å to 1000 Å.

At the time the polycrystal silicon film is to be annealed with the irradiation of ruby laser beam or excimer laser beam, the layer region to be irradiated with such laser beam may be fused or not fused. However in the case where said layer region is fused, widening the size of a grain may be rather effectively carried out.

When annealed by the irradiation of said laser beam, hydrogen atom and fluorine atom will be liberated from the polycrystal silicon film and as a result, their concentrations therein will be reduced. In this case, the concentration of hydrogen atom and that of fluorine atom may be adjusted to respective desired levels by repeating the foregoing heat-treatment in a gaseous plasma atmosphere, for example, under the following conditions;

| | |
|---|---|
| substrate temperature: | 100 to 300° C. |
| inner pressure: | $10^{-5}$ to $10^{-1}$ Torr |
| high frequency power: | $10^{-3}$ to 1 W/m$^2$ |

In this way, there may be obtained a desirable polycrystal silicon film which is desirably small in the number of grain boundaries, low in localized state density and which has a desirably small concentration of hydrogen atom in the layer region near the surface.

Other than the above, the incorporation of hydrogen atom and that of fluorine atom into a polycrystal silicon film, it is possible for them to be carried out at the time when said film is formed whereby a desired polycrystal silicon film is obtained.

For the formation of such polycrystal silicon film, it may be carried out in accordance with a known film forming process such as plasma CVD process including HR-CVD process, reactive sputtering process or ion-plating process.

In the following, explanation will be made about the case where a polycrystal silicon film is formed by way of HR-CVD process in which different radicals being associated and/or chemically reacted to form said film on a substrate.

That is, under said HR-CVD process, there are provided an active species A generated from a compound (i) containing silicon atom and halogen by activating said compound (i) with the action an activation energy, an active species B reactive with said active species A which is generated from a compound (ii) containing hydrogen atom or/and halogen atom by activating said compound (ii) with the action an activation energy, and a compound (iii) capable of liberating hydrogen atom, a compound (iv) capable of liberating fluorine atom or a compound (v) capable of liberating both hydrogen atom and fluorine atom. Any of the compounds (iii) to (v) may be active species C generated from such compound by activating it with the use of an activation energy.

In a typical embodiment, the active species A, the active species B, and the compound (iii) and compound (iv) are introduced into a film forming space having a substrate being maintained with a desired temperature and they are chemically reacted in the space surrounding the surface of the substrate while applying a light energy source thereinto to cause the formation of an objective polycrystal silicon film thereon. And the amount of hydrogen atom and the amount of fluorine atom to be incorporated into said film may be adjusted by properly controlling the flow rates of gaseous raw materials capable of liberating hydrogen atom and fluorine atom. And in the case where light energy source is applied into the reaction space in the above case, the introduction of hydrogen atom and the introduction of fluorine atom into said film are further facilitated. In this case, the adjustments of the amounts of hydrogen atom and fluorine atom are further improved by properly controlling the power of said light energy source to be applied.

Usable as the compound (i) to be used for the generation of an active species A are, for example, $Si_nY_{2n+2}$ (n is an integer of 1 or more and Y is F, Cl, Br or I), $Si_nY_{2n}$ (n is an integer of 3 or more and Y has the same meaning as defined above), $Si_nH_xY_y$ [n is an integer of 1 or more, Y has the same meaning as defined above, and $x+y=2n$ or $2n+2$ (n is an integer of 1 or more)], etc.

Specific examples are $SiF_4$, $(SiF_2)_4$, $(SiF_2)_5$, $(SiF_2)_6$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Br_6$, $SiHBr_3$, $Si_2Cl_6$, $SiHCl_3$, $SiH_3Cl$, $SiH_2Cl_2$, $SiHI_3$, $Si_2Cl_2F_3$, etc. which are in the gaseous state or can be easily made to be in the gaseous state.

In order to generate an active species A from such compound (i), it is possible to together use silicon monomer, other silicon compound, hydrogen gas or halogen gas such as $F_2$, $Cl_2$, $Br_2$ or $I_2$ in addition to said compound (i).

The generation of an active species A may be carried out by introducing said compound (i) into an active species A generation space (1) with which an activation energy applying means is provided and which is connected through a feed pipe to a film forming space, and subjecting it to the action of an activation energy source such as electric discharge of microwave, radio frequency (RF), low-frequency or direct current (DC), heat of electric heater or infrared or light from the activation energy applying means. The thus generated active species A is successively introduced into the film forming space.

Usable as the compound (ii) to be used for the generation of an active species B are, for example, $H_2$ gas, halogen gas such as $F_2$, $Cl_2$, gaseous $Br_2$ and gaseous $I_2$, etc.

In the case where an active species B is generated from such compound (ii), it is possible to use an inert gas such as He, Ar or Ne in addition to said compound (ii).

And it is possible to use a plurality of said compounds (ii) at the time of generating an active species B.

The generation of an active species B may be carried out by introducing said compound (ii) into an active species B generation space (2) with which an activation energy applying means is provided and which is connected through a feed pipe to the foregoing film forming space, and subjecting it to the action of an activation energy source such as above mentioned in the case of generating an active species A from the activation energy applying means. The thus generated active species B is successively introduced into the foregoing film forming space.

The quantitative ratio of an active species A to an active species B to be introduced into the film forming space in order to form an objective polycrystal silicon film should be properly determined depending upon the related film forming conditions to be employed and the kinds of the active species A and B to be used. However, it is preferably 10:1 to 1:10, and more preferably, 8:2 to 4:6 based on the flow ratio.

Now, as the compound (iii) capable of liberating hydrogen atom which is used in order to purposely incorporate hydrogen atom into a polycrystal silicon film to be formed, $H_2$ gas is effectively used. However, it is more effective when hydrogen radical (H*) is used. In this case, it is possible to use an inert gas such as He, Ar and Ne.

As the compound (iv) capable of liberating fluorine atom which is used in order to purposely incorporate fluorine atom into a polycrystal silicon film to be formed, there may be illustrated $F_2$, carbon fluorides such as $CHF_3$, $CF_4$, $C_2F_6$, $CBrF_3$, $CCl_2F_2$, $CCl_3F$, $CClF_3$, $C_2Cl_2F_4$, etc., other than these compounds, $BF_3$, $SF_6$, $NF_3$, $PF_3$, $XeF_2$, etc. However, it is more effective when fluorine radical (F*) or fluorine ion such as $CF^{3+}$ is used.

These compounds (iii) and (iv) may be separately or together introduced into the film forming space while controlling their flow rates so that desired amounts of the hydrogen atom and the fluorine atom be incorporated into a polycrystal silicon film to be formed.

In an alternative, it is possible to incorporate hydrogen atom and fluorine atom into a polycrystal silicon film at the same time by using the compound (v) i.e. a specific compound such as HF or a gaseous combined mixture of $HCl+F_2$, $HBr+F_2$, $HI+F_2$, $ClF_3+H_2$, $BrF_3+H_2$ or $IF_3+H_2$. In this case, it is a matter of course to properly control the flow rate of a gaseous material or a gaseous mixture when it is introduced into the film forming space.

In a preferred embodiment in the case of incorporating specific amounts of the hydrogen atom and the fluorine atom into a polycrystal silicon film to be formed, it is desired to apply a light energy source of mercury vapor lamp, xenon arc lamp, $CO_2$ laser, Ar-ion laser, or excimer laser onto the compound (iii) and the compound (iv), or the compound (v) as introduced in the film forming space while controlling their flow rates to thereby generate hydrogen radical (H*), fluorine radical (F*), fluorine ion ($CF^{3+}$) etc. In this case, the incorporations of the hydrogen atom and the fluorine atom into a polycrystal silicon film to be formed may be further facilitated.

In this invention, the thus formed polycrystal silicon film to constitute the semiconductor layer of a FE-TFT to be provided may be of p-type or n-type by doping the resultant film with a p-type impurity or an n-type impurity.

As the p-type impurity, there may be used an element of Group IIIA of the Periodic Table such as B, Al, Ga, In, Tl, etc. As the n-type impurity, there may be used an element of Group VA of the periodic Table such as P, As, Sb, B i, etc. Among these elements, B, Ga, P and Sb are most preferred.

The amount of such impurity to be contained in the film may be optionally determined in accordance with its end use.

As a substance capable of incorporating such impurity into the film, a substance which is in the gaseous state at room temperature or another substance which can be easily made in the gaseous state may be employed.

Usable as such substance are, for example, $PH_3$, $P_2H_4$, $PF_3$, $PF_5$, $PCl_3$, $AsH_3$, $AsF_3$, $AsF_5$, $AsCl_3$, $SbH_3$, $SbF_5$, SiH$_3$, BF$_3$, BCl$_3$, BBr$_3$, B$_2$H$_6$, B$_4$H$_{10}$, B$_5$H$_9$, B$_5$H$_{11}$, B$_6$H$_{10}$, B$_6$H$_{12}$, AlCl$_3$, etc.

Now, explanation will be made about the preparation of a FE-TFT according to this invention with reference to the drawings.

FIG. 1 is a schematic explanatory view for the purpose of observing the effectiveness of the foregoing polycrystal silicon film as a semiconductor layer for the FE-TFT. In FIG. 1, there shown substrate 101 and semiconductor layer 102 formed from a polycrystal silicon film.

Figure 2:
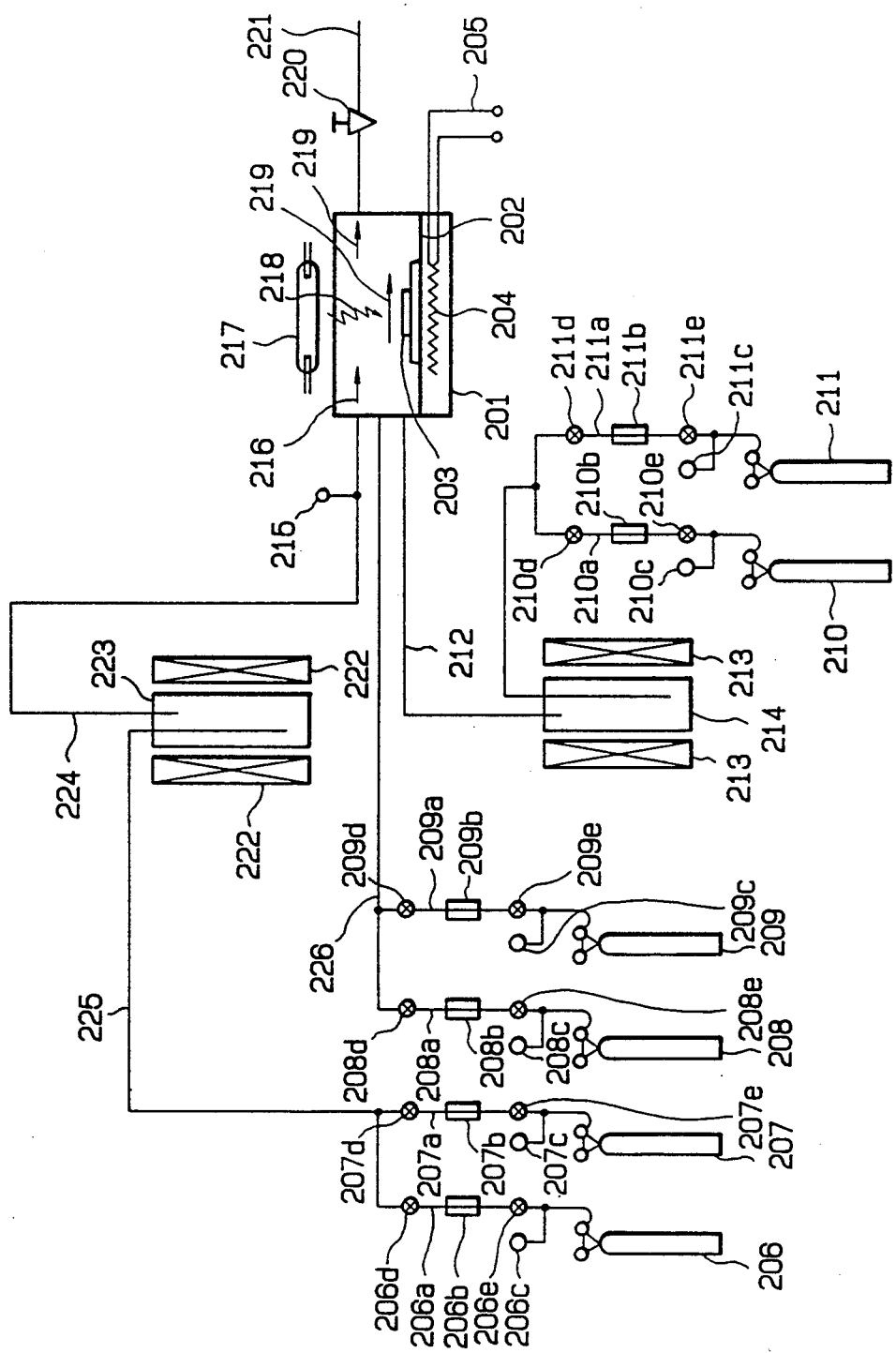
FIG. 2 is a schematic diagram of a HR-CVD apparatus suitable for forming a polycrystal silicon film in accordance with the process of this invention.

The specific polycrystal silicon film as above described to constitute the FE-TFT of this invention may be effectively formed in accordance with a know HR-CVD process using a fabrication apparatus as shown in FIG. 2.

In FIG. 2, 201 stands for a film forming chamber having a film forming space in which a substrate holder 202 for a substrate 203 having electric heater 204 connected to a power source (not shown) by means of lead wires 205, 205 is provided.

The film forming chamber 201 is provided with an exhaust pipe 221 connected through main valve 220 to an exhaust pump (not shown), and the exhaust pipe is provided with a subsidiary valve (not shown) serving to break the vacuum in the film forming chamber 201.

The film forming chamber 201 is also provided with a light energy power source 217 to apply a light energy source through the upper wall made of a light transmissive material such as quartz glass plate into its film forming space.

As the light energy power source, there may be illustrated mercury-vapor lamp, xenon arc lamp, carbon dioxide laser, argon-ion laser, excimer laser, etc.

224 stands for a feed pipe serving to introduce an active species B from an active species B generation chamber 223 into the film forming space of the film forming chamber 201. The active species B generation chamber is provided with an activation energy power source 222 for electric discharge of microwave, RF, low-frequency, or DC, heat or light serving to apply an activation energy on a gaseous raw material for generating an active species B to be introduced thereinto through a feed pipe 225 extended from gas reservoir 206 (for example, for H$_2$ gas) and gas reservoir 207 (for example, for Ar gas), wherein a to e stand for pipe way, mass-flow controller, pressure gage, valve and another valve respectively.

226 stands for a feed pipe serving to introduce a gaseous raw material capable liberating hydrogen atom [compound(iii)] and another gaseous raw material capable of liberating fluorine atom [compound (iv)] from gas reservoir 208 (for H$_2$ gas) and gas reservoir 209 (for F$_2$ gas) into the film forming space of the film forming chamber 201, wherein a to e have the same meaning as above mentioned.

212 stands for a feed pipe serving to introduce an active species A from an active species A generation chamber 214 into the film forming space of the film forming chamber 201. The active species A generation chamber is provided with an activation energy power source 213 for electric discharge of microwave, RF, low-frequency or DC, heat or light serving to apply an activation energy on a gaseous raw material for generating an active species A to be introduced thereinto through a feed pipe extended from gas reservoir 210 (for example, for SiF$_4$ gas) and gas reservoir 211 (for example, for Ar gas), wherein a to e have the same meanings as above mentioned.

Arrows 216 and 219 stand for flow directions of gaseous raw materials as introduced in the film forming space of the film forming chamber 201.

The present inventor has conducted the following experiments in order to confirm the usability of a polycrystal silicon film as the semiconductor layer for a FE-TFT which is prepared in accordance with the HR-CVD process of this invention using the fabrication apparatus shown in FIG. 2.

EXPERIMENT 1

(1) Formation of a polycrystal silicon film and evaluations on the resulting film As the substrate 203, there was used a Corning's No. 7059 glass plate (product of Corning Glass Wear, Inc., U.S.A.).

This glass plate was firmly attached onto the surface of the substrate holder 202. Then, there was formed a polycrystal silicon film on the surface of the glass plate under the film forming conditions shown in Table 1.

That is, the electric heater 204 was actuated to uniformly heat the glass plate to about 350° C., and it was kept at this temperature.

Thereafter, the air in the film forming space of the film forming chamber 201 was evacuated to bring the space to a vacuum of about $10^{-6}$ Torr. Successively, H$_2$ gas was fed into the active species B generation chamber 223 then into the film forming space at a flow rate of 50 SCCM.

At the same time, SiF$_4$ gas was fed into the active species A generation chamber 214 then into the film forming space of the film forming chamber 201 at a flow rate of 20 SCCM.

Concurrently, H$_2$ gas was fed through the feed pipe 212 into the film forming space of the film forming chamber 201 at a flow rate of 10 SCCM.

After the flow rates of the above raw material gases became stable, the inner pressure of the film forming space was adjusted to a vacuum of about 0.02 Torr.

Then, the activation power source (microwave power source) 222 and the activation power source (microwave power source) 213 were switched on at the same time to apply respective microwave energies into the respective activation chambers 223 and 214 whereby generating an active species B (such as hydrogen radical H*) and an active species A (such as SiF*, SiF$^{3+}$, etc.) respectively, which were successively introduced into the film forming space. Concurrently, the light energy power source (xenon arc lamp) 217 was switched on to apply a light energy of 1 KW into the film forming space.

During the film forming process, the flow rate of the H$_2$ gas to be fed through the feed pipe 226 was changed with the passage of time in accordance with the flow variation curve as shown in FIG. 3.

After this state being maintained for 40 minutes, there was formed a polycrystal silicon film of about 5000 Å in thickness at a deposition rate of about 2 Å/sec.

The crystallinity of the thus obtained film was evaluated in accordance with a conventional X-ray diffraction analysis and a conventional electron diffraction analysis. As a result, it was found that the resultant film is a polycrystal silicon film. Further, as a result of examining this polycrystal silicon film using a known electron microscope, it was found that the mean value of grain sizes in the film is about $5\pm0.2$ μm. And it was also found that there is not any undesirable unevenness among those grain sizes in the entire layer region.

In addition, as a result of examining the surface state of the above film using a known scanning electron microscope, it was found that the surface excels in smoothness, it does not have any wave, and the unevenness in the layer thickness is less than $\pm 4\%$.

(2) Various observations on the foregoing polycrystal silicon film

There was formed an aluminum gap electrode on the surface of the foregoing polycrystal silicon film layer in accordance with a conventional vacuum evaporation method.

Then, in accordance with a conventional method, there was measured a dark current with a impressed voltage of 10 V to obtain a dark current value ($\sigma d$). Further, in accordance with a conventional secondary ion mass spectrometry (SIMS), there was examined a profile of the hydrogen content in the depth direction of the film layer.

In addition, in accordance with a conventional field effect method and conventional ESR method, there was examined a localized state density in the film layer.

Figure 9:
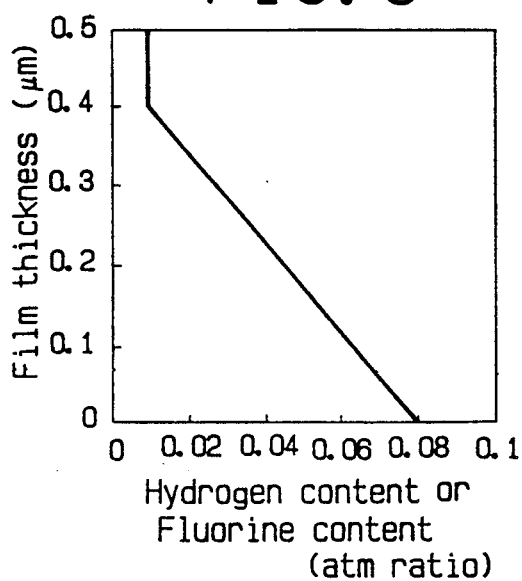
FIG. 9, FIG. 10, FIG. 11, FIG. 12, FIG. 13 and FIG. 14 are concentration distribution curves of the hydrogen atom or the fluorine atom contained in polycrystal silicon films formed according to the process of this invention.
Figure 16:
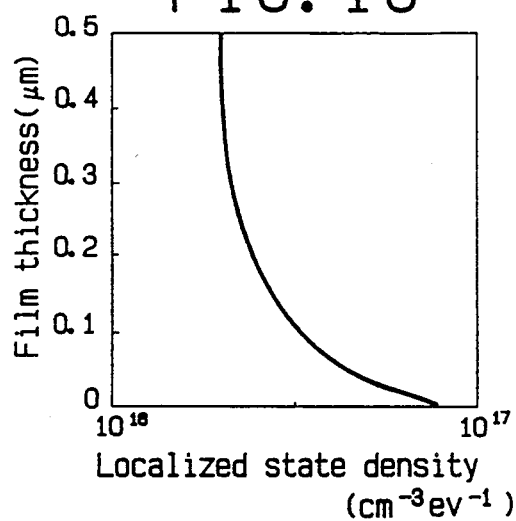
FIG. 16 and FIG. 17 are distribution curves of a localized state density in polycrystal-silicon films formed according to the process of this invention.

The results obtained were as shown in Table 2, FIG. 9 (concerning hydrogen content) and FIG. 16 (concerning localized state density).

As FIG. 9 illustrates, it is understood for the foregoing polycrystal silicon film that the concentration distribution of the hydrogen atom contained therein is in the state that it is gradually decreased in the thickness direction and it is thick in a layer region in the side of the substrate but thin in a layer region in the opposite side.

And as FIG. 16 illustrates, it is understood that the localized state density in the film layer has a similar decreasing tendency in the thickness direction to that of the hydrogen content according to FIG. 9, it is thick in a layer region in the side of the substrate but thin in a layer region in the opposite side and it is decreased to a value of less than $10^{17}$ cm$^{-3}$ev$^{-1}$.

In Table 2, there are shown, among others, the content of the fluorine atom and the localized state density for the film layer of about 0.5 μ in depth.

And, other than the above, as a result of examining the foregoing polycrystal silicon film in accordance with a conventional infrared spectrometry, it was found that the ratio of the peak in 2000 cm$^{-1}$ to the peak in 2100 cm$^{-1}$ is 0.7, which is less than 1 as shown in Table 2.

From what above stated, it is understood that the polycrystal silicon film to be formed according to the process of this invention is desirably suited for use in the preparation of a FE-TET.

EXPERIMENT 2

The procedures of Experiment 1 were repeated, except that there was used $F_2$ gas in stead of the $H_2$ gas, to thereby form a polycrystal silicon film under the film forming conditions as shown in Table 3.

The resultant polycrystal silicon film was evaluated by repeating the evaluation procedures of Experiment 1.

As a result, there were obtained the results as shown in Table 4, FIG. 9 and FIG. 16.

From those results obtained, it is understood that also in the case of introducing $F_2$ gas into the film forming space, there may be obtained a desirable polycrystal silicon film as well as the case of Experiment 1.

EXPERIMENT 3

The procedures of Experiment 1 were repeated, except that there was introduced $F_2$ gas with the same flow condition as that for $H_2$ gas in addition to the $H_2$ gas, to thereby form a polycrystal silicon film.

The resultant polycrystal silicon film were examined by repeating the evaluation procedures of Experiment 1.

Figure 18:
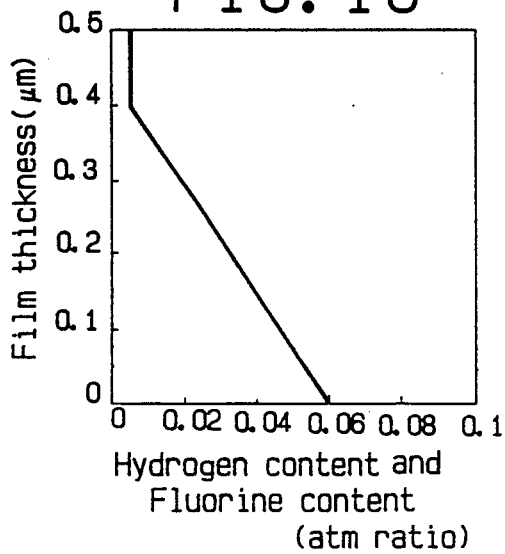
FIG. 18 and FIG. 19 are concentration distribution curves of both the hydrogen and fluorine atoms in polycrystal silicon films formed according to this invention.

As a result, there were obtained the results as shown in FIG. 18 with respect to the concentration distributions of the hydrogen atom and the fluorine atom in the film.

And there were obtained the results as shown in FIG. 20 with respect to the localized state density in the film.

From these results and other evaluated results, it is understood that the resultant polycrystal silicon film is desirably suited for use in the preparation of a FE-TFT.

Figure 15:
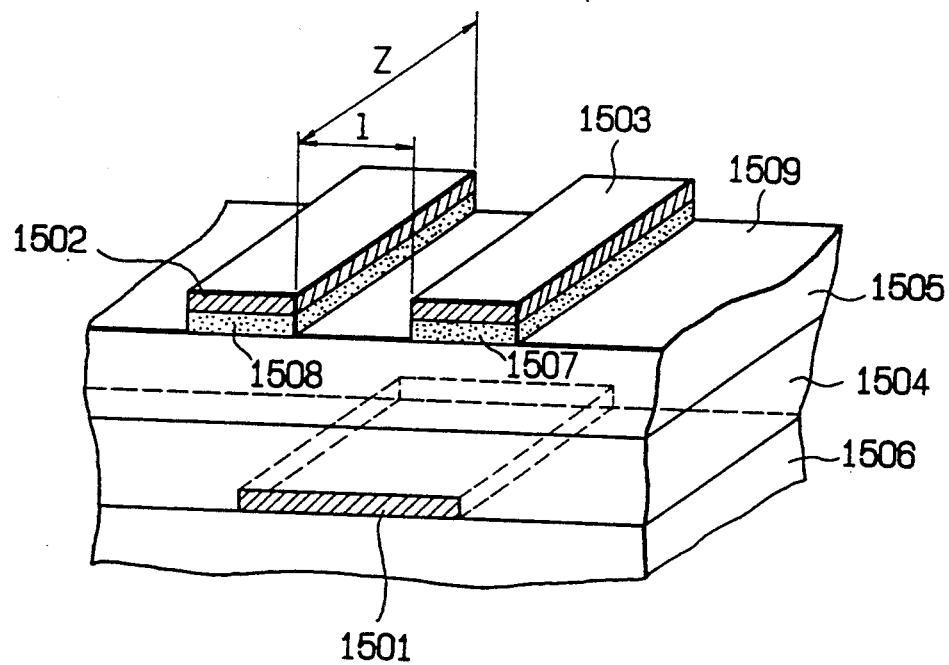
FIG. 15 is a schematic perspective view, partly broken away of a FE-TFT according to this invention.

Now, explanation will made about a FE-TFT to be provided according to this invention with reference to FIG. 15.

FIG. 15 is a schematic perspective view, partly broken away, of a FE-TFT according to this invention, in which are shown substrate 1506 made of quartz glass or ceramics, gate electrode 1501, electrically insulated layer 1504, semiconductor layer 1505 formed from a polycrystal silicon film according to this invention, first and second n+—layers 1507, 1508 being disposed on the surface 1509 of the semiconductor layer 1505, source electrode 1502 being disposed on the first n+layer, and drain electrode 1503 being disposed on the second n+ layer.

In the preparation of the above FE-TFT, the first n+—layer 1507 and the second n+—layer to be disposed in contact with the surface of the semiconductor layer 1505 are formed successively after the formation of the semiconductor layer 1505 without the surface of said semiconductor layer being exposed to the open air or oxygen gas.

In the case of the above FE-TFT shown in FIG. 15, the distance (L) between the source electrode 1502 and the drain electrode 1503 is 50 μm, and the length (Z) of the source electrode 1502 and the length (Z) of the drain electrode 1503 are 10 mm respectively.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

The procedures for forming a polycrystal silicon film of Experiment 1 using the fabrication apparatus shown in FIG. 2 under the film forming conditions shown in Table 1 were repeated, except that the flow rate of the $H_2$ gas to be fed through the feed pipe 226 was changed with the passage of time in accordance with the flow variation curve as shown in FIG. 4, to thereby form a polycrystal silicon film.

Figure 17:
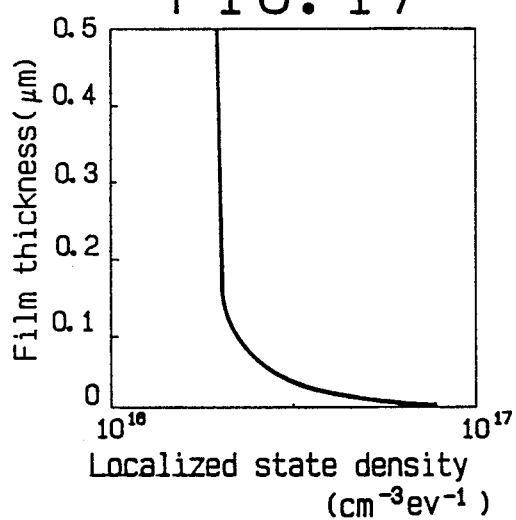

The resultant polycrystal silicon film was evaluated by repeating evaluation procedures of Experiment 1. The results obtained were as shown in FIG. 10 and FIG. 17.

Figure 10:
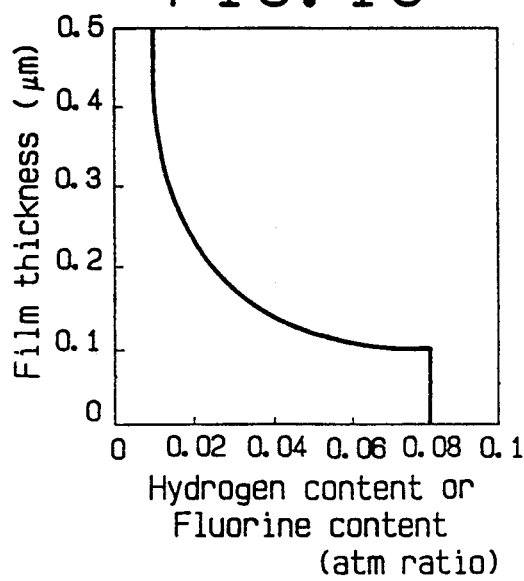

As FIG. 10 illustrates, it is understood that the concentration distribution of the hydrogen atom contained in the film is in the state that it is gradually decreased in the thickness direction, and it is thick in a layer region in the side of the substrate but thin in a layer region in the opposite side. And as FIG. 17 illustrates, it is understood that the localized state density in the film has a similar decreasing tendency in the thickness direction to that of the hydrogen content according to FIG. 10, and it is decreased to a value of less than $10^{17}$ cm$^{-3}$ ev$^{-1}$. And, it was found that the ratio of the peak in 2000 cm$^{-1}$ to the peak in 2100 cm$^{-1}$ is 0.8.

It was also found that the value of σd is $7 \times 10^{-4}$ $(\Omega.cm)^{-1}$.

It was further found that the mean value of grain sizes in the film is 4.3μ.

In view of the above, it is understood that the foregoing polycrystal film is desirably suited for use as a semiconductor layer for a FE-TFT.

EXAMPLE 2

The procedures of Experiment 1 were repeated to thereby a plurality of polycrystal silicon film samples (Samples Nos. 2-1 to 2-4).

For the preparation of each sample, the introduction of H$_2$ gas through the feed pipe 226 into the film forming space was carried out in accordance with the flow variation curve shown in Table 5.

For every resultant polycrystal silicon sample, various evaluations were made by repeating the evaluation procedures of Experiment 1.

The results obtained were as shown in Table 5.

From the thus obtained results, it was found that every resultant sample is satisfactory in every evaluation item. And it was also found that for every polycrystal silicon sample, the concentration distribution of the hydrogen atom contained therein is in the state that it is gradually decreased in the thickness direction, and it is thick in a layer region in the side of the substrate but thin in a layer region in the opposite side.

EXAMPLE 3

There were prepared two FE-TFT samples of the type shown in FIG. 15 (Samples Nos. 3-1 and 3-2) in accordance with the foregoing procedures for the preparation of a FE-TFT of the type shown in FIG. 15.

As for the formation of the semiconductor layer 1505 formed from a polycrystal silicon film, the procedures for the formation of a polycrystal silicon of Experiment 1 were repeated.

Figure 8:
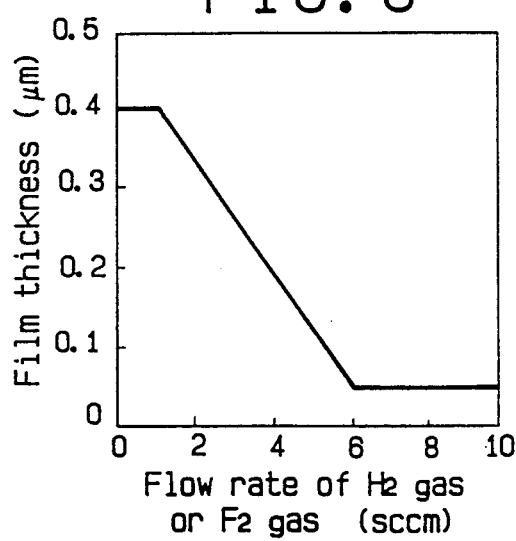

And, as for the introduction of H$_2$ gas through the feed pipe 226 into the film forming space, the flow variation curve shown in FIG. 4 was employed for Sample No. 3-1, and the flow variation curve shown in FIG. 8 was employed for Sample No. 3-2.

For each of the resultant FE-TFT samples (Samples Nos. 3-1 and 3-2), there were examined TFT characteristics by grounding the drain electrode to earth and applying varied plus voltages onto the source electrode and the gate electrode in accordance with conventional methods.

As for the I$_D$ (drain electrode)−V$_D$ (drain voltage) characteristics, there were obtained good saturation characteristics for every sample. There was also obtained a high electric current of $5 \times 10_{-3}$. A with 10 V-gate voltage and 10 V-drain voltage.

The TFT characteristics obtained as a result of examining I$_D$ (drain current) by changing the gate voltage V$_G$ were as shown in Table 6.

From the above results obtained, it was found that every FE-TFT sample having a polycrystal silicon semiconductor layer has a wealth of many practically applicable TFT characteristics.

EXAMPLE 4

(1) There were prepared two polycrystal silicon film samples (Samples Nos. 4-1 and 4-2) by repeating the procedures for the formation of a polycrystal silicon film of Experiment 1, except that the flow rates of SiF$_4$ and H$_2$ gas for generating an active species B, the discharging microwave energy power and the substrate temperature were changed as shown in Table 7. The resultant polycrystal silicon film samples (Samples Nos. 4-1 and 4-2) were examined by repeating the evaluation procedures of Experiment 1. The results obtained were as shown in Table 8.

As Table 8 illustrates, it is understood that every resultant polycrystal silicon film sample is satisfactory for every evaluation item.

(2) There were prepared two FE-TFT samples (Samples Nos. 5-1 and 5-2) by repeating the procedures of Example 3, except that the semiconductor layer 1505 was formed under the same conditions as in the above case (1) for every sample.

For every resultant FE-TFT sample, there were examined TFT characteristics by repeating the procedures of Example 3. The results obtained were as shown in Table 9. As Table 9 illustrates, it is understood that every resultant FE-TFT sample is satisfactory in every evaluation item.

EXAMPLE 5

The procedures for forming a polycrystal silicon film of Experiment 1. using the fabrication apparatus shown in FIG. 2 under the film forming conditions shown in Table 3 were repeated, except that the flow rate of the F$_2$ gas to be fed through the feed pipe 226 was changed with the passage of time in accordance with the flow variation curve as shown in FIG. 4, to thereby form a polycrystal silicon film.

The resultant polycrystal silicon film was evaluated by repeating evaluation procedures of Experiment 1.

The results obtained were as shown in FIG. 10 and FIG. 17.

As FIG. 10 illustrates, it is understood that the concentration distribution of the fluorine atom contained in the film is in the state that it is gradually decreased in the thickness direction, and it is thick in a layer region in the side of the substrate but thin in a layer region in the opposite side. And as FIG. 17 illustrates, it is understood that the localized state density in the film has a similar decreasing tendency in the thickness direction to that of the fluorine content according to FIG. 10 and it is decreased to a value of less than $10^{17}$ cm$^{-3}$ ev$^{-1}$. And, it was found that the ratio of the peak in 2000 cm$^{-1}$ to the peak in 2100 cm$^{-1}$ is 0.8.

It was also found that the value of σd is $8 \times 10^{-4}$ $(\Omega.cm)^{-1}$.

It was further found that the mean value of grain sizes in the film is 5μ.

In view of the above, it is understood that the foregoing polycrystal film is desirably suited for use as a semiconductor layer for a FE-TFT.

EXAMPLE 6

The procedures of Example 5 were repeated to thereby a plurality of polycrystal silicon film samples (Samples Nos. 6-1 to 6-4).

For the preparation of each sample, the introduction of $F_2$ gas through the feed pipe 226 into the film forming space was carried out in accordance with the flow variation curve shown in Table 10.

For every resultant polycrystal silicon sample, various evaluations were made by repeating the evaluation procedures of Experiment 1.

The results obtained were as shown in Table 10.

From the thus obtained results, it was found that every resultant sample is satisfactory in every evaluation item. And it was also found that for every polycrystal silicon sample, the concentration distribution of the fluorine atom contained therein is in the state that it is gradually decreased in the thickness direction, and it is thick in a layer region in the side of the substrate but thin in a layer region in the opposite side.

EXAMPLE 7

There were prepared two FE-TFT samples of the type shown in FIG. 15 (Samples Nos. 7-1 and 7-2) in accordance with the foregoing procedures for the preparation of a FE-TFT of the type shown in FIG. 15.

As for the formation of the semiconductor layer 1505 formed from a polycrystal silicon film, the procedures for the formation of a polycrystal silicon of Example 5 were repeated.

And, as for the introduction of $F_2$ gas through the feed pipe 226 into the film forming space, the flow variation curve shown in FIG. 4 was employed for Sample No. 7-1, and the flow variation curve shown in FIG. 8 was employed for Sample No. 7-2.

For each of the resultant FE-TFT samples (Samples Nos. 7-1 and 7-2), there were examined TFT characteristics by grounding the drain electrode to earth and applying varied plus voltages onto the source electrode and the gate electrode in accordance with conventional methods.

As for the $I_D$ (drain electrode) - $V_D$ (drain voltage) characteristics, there were obtained good saturation characteristics for every sample. There was also obtained a high electric current of $5 \times 10^{-3}$. A with 10 V-gate voltage and 10 V-drain voltage.

The TFT characteristics obtained as a result of examining $I_D$ (drain current) by changing the gate voltage $V_G$ were as shown in Table 11.

From the above results obtained, it was found that every FE-TFT sample having a polycrystal silicon semiconductor layer has a wealth of many practically applicable TFT characteristics.

EXAMPLE 8

(1) There were prepared two polycrystal silicon film samples (Samples Nos. 8-1 and 8-2) by repeating the procedures for the formation of a polycrystal silicon film of Example 5, except that the flow rates of $SiF_4$ and $H_2$ gas for generating an active species B, the discharging microwave energy power and the substrate temperature were changed as shown in Table 12. The resultant polycrystal silicon film samples (Samples Nos. 8-1 and 8-2) were examined by repeating the evaluation procedures of Experiment 1. The results obtained were as shown in Table 13.

As Table 13 illustrates, it is understood that every resultant polycrystal silicon film sample is satisfactory for every evaluation item.

(2) There were prepared two FE-TFT samples (Samples Nos. 9-1 and 9-2) by repeating the procedures of Example 3, except that the semiconductor layer 1505 was formed under the same conditions as in the above case (1) for every sample.

For every resultant FE-TFT sample, there were examined TFT characteristics by repeating the procedures of Example 3. The results obtained were as shown in Table 14. As Table 14 illustrates, it is understood that every resultant FE-TFT sample is satisfactory in every evaluation item.

EXAMPLE 9

(1) There were prepared two polycrystal silicon film samples Samples (A) and (B) by repeating the procedures of Experiment 3, except that the introductions of $H_2$ gas and $F_2$ gas for Sample (A) were carried out in accordance with the flow variation curve shown in FIG. 3 and the introductions of $H_2$ gas and $F_2$ gas for Sample (B) were carried out in accordance with the flow variation curve shown in FIG. 4.

For every resultant sample, there were examined the concentration distributions of the hydrogen atom and the fluorine atom and the localized state density in the film by repeating the evaluation procedures of Experiment 1.

Figure 19:
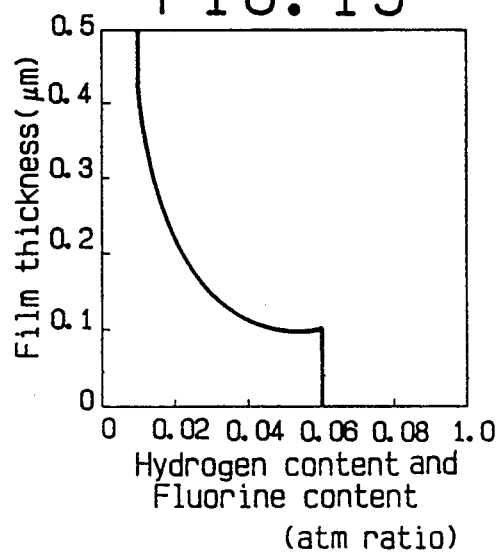

As a result, there were obtained the results as shown in FIGS. 18 to 19 for Sample (A) and also in FIGS. 20 to 21 for Sample (B).

From the results thus obtained, it was found that as for every sample, the localized state density decreases as the hydrogen and fluorine contents decrease and it is decreased to a value of less than $10^{17}$ cm$^{-3}$ ev$^{-1}$.

(2) There were prepared two FE-TFT samples [Samples (C) and (D)] by repeating the procedures of Example 3, except that the semiconductor 1505 was formed under the same conditions as in the above case (1) for every sample.

For every resultant FE-TFT sample, there were examined TFT characteristics by repeating the procedures of Example 3. The results obtained were as shown in Table 15. As Table 15 illustrates, it is understood that every resultant FE-TFT sample is satisfactory in every evaluation item.

TABLE 1

|  | Gas used | Flow rate (SCCM) | Discharge power (W) | Substrate temperature (°C.)* | Inner pressure (Torr)* | Light energy source* | Deposition rate (Å/sec.)* | Deposition period (min.)* |
|---|---|---|---|---|---|---|---|---|
| Active species A generation chamber | $SiF_4$ | 20 | 500 |  |  |  |  |  |
| Active species B generation chamber | $H_2$ | 50 | 200 | 350 | 0.02 | Xe lamp 1 KW | 2 | 40 |
| Condition for | $H_2$ | 10→0 | — |  |  |  |  |  |

TABLE 1-continued

| | Gas used | Flow rate (SCCM) | Discharge power (W) | Substrate temperature (°C)* | Inner pressure (Torr)* | Light energy source* | Deposition rate (Å/sec.)* | Deposition period (min.)* |
|---|---|---|---|---|---|---|---|---|
| introducing H | | | | | | | | |

*in the film forming chamber

TABLE 2

| Experiment No. | $\sigma d$ ($\Omega^{-1} \cdot cm^{-1}$) | Average grain size (μm) | Content of F in a film (atomic ratio) | Localized state density in a film ($cm^{-3} \cdot ev^{-1}$) | IR spectrum ratio (peak of 2000 $cm^{-1}$/ peak of 2100 $cm^{-1}$) |
|---|---|---|---|---|---|
| 1 | $9.2 \times 10^{-4}$ | 5.0 | 0.08 | $4.2 \times 10^{16}$ | 0.7 |

TABLE 3

| | Gas used | Flow rate (SCCM) | Discharge power (W) | Substrate temperature (°C)* | Inner pressure (Torr)* | Light energy source* | Deposition rate (Å/sec.)* | Deposition period (min.)* |
|---|---|---|---|---|---|---|---|---|
| Active species A generation chamber | $SiF_4$ | 20 | 500 | | | | | |
| Active species B generation chamber | $H_2$ | 50 | 200 | 350 | 0.02 | Xe lamp 1 KW | 2 | 40 |
| Condition for introducing F | $F_2$ | 10→0 | — | | | | | |

*in the film forming chamber

TABLE 4

| Experiment No. | $\sigma d$ ($\Omega^{-1} \cdot cm^{-1}$) | Average grain size (μm) | Content of F in a film (atomic ratio) | Localized state density in a film ($cm^{-3} \cdot ev^{-1}$) |
|---|---|---|---|---|
| 2 | $8.1 \times 10^{-4}$ | 5.0 | 0.05 | $5 \times 10^{16}$ |

TABLE 5

Figure 7:
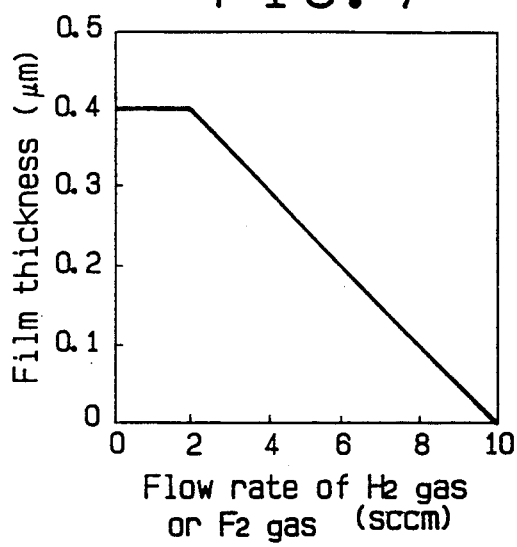
Figure 11:
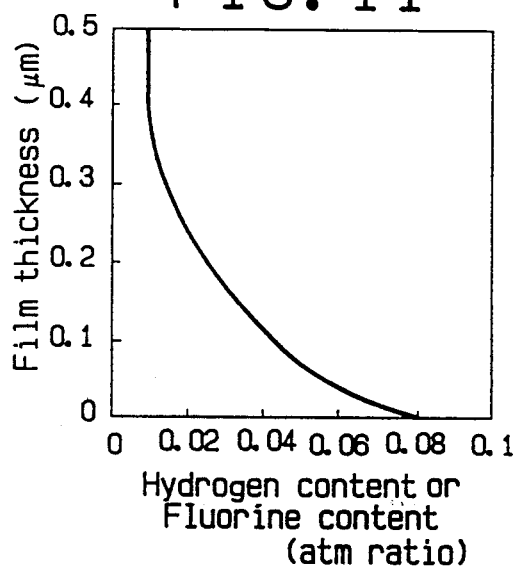
Figure 12:
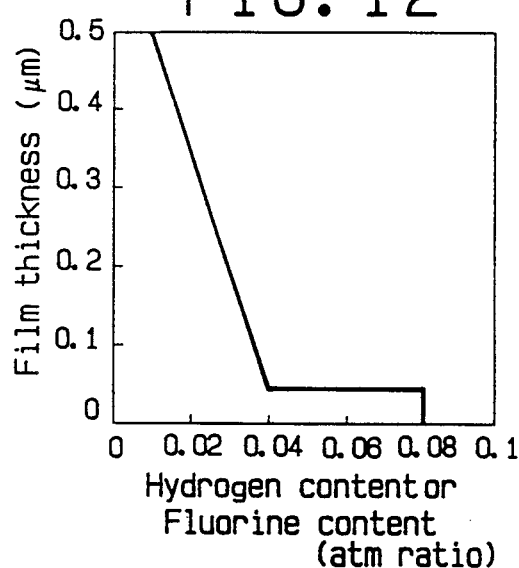
Figure 13:
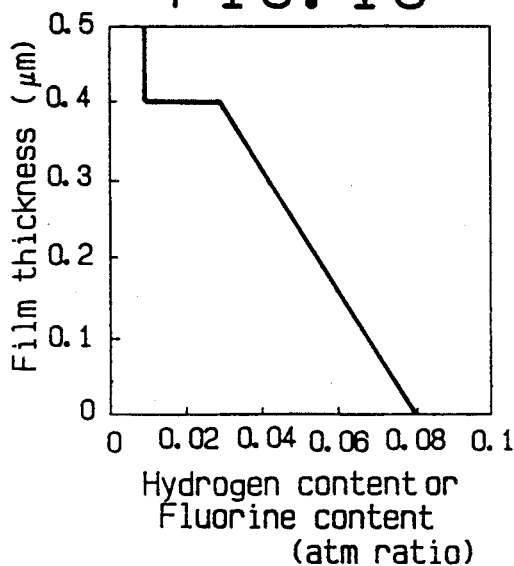
Figure 14:
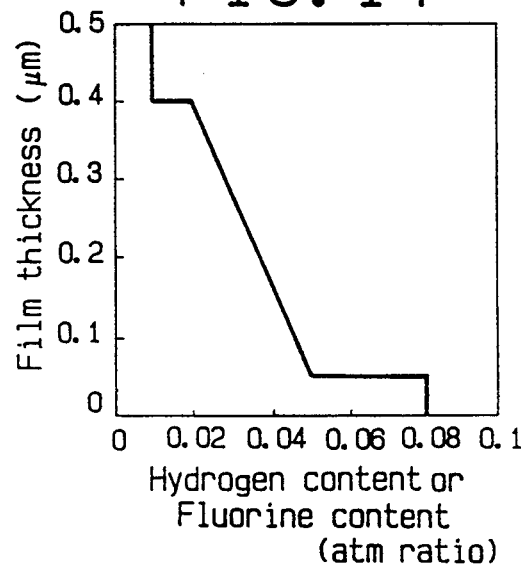

| Sample No. | Profile of the flow rate for $H_2$ gas | Profile of the content of H in a film | Average grain size (μm) | Localized state density in a film ($cm^{-3} \cdot ev^{-1}$) | IR spectrum ratio (peak in 2000 $cm^{-1}$/ peak in 2100 $cm^{-1}$) | $\sigma d$ ($\Omega^{-1} \cdot cm^{-1}$) |
|---|---|---|---|---|---|---|
| 2-1 | FIG. 5 | FIG. 11 | 4.0 | $4 \times 10^{16}$ | 0.65 | $5.5 \times 10^{-4}$ |
| 2-2 | FIG. 6 | FIG. 12 | 3.7 | $3 \times 10^{16}$ | 0.7 | $6 \times 10^{-4}$ |
| 2-3 | FIG. 7 | FIG. 13 | 4.6 | $6 \times 10^{16}$ | 0.85 | $2 \times 10^{-4}$ |
| 2-4 | FIG. 8 | FIG. 14 | 3.9 | $5 \times 10^{16}$ | 0.7 | $4 \times 10^{-4}$ |

TABLE 6

| Sample No. | The ratio of the maximum value for drain current to its minimum value* | Field effect mobility** ($cm^2/v \cdot sec$) | Threshold voltage (V) |
|---|---|---|---|
| 3-1 | $8 \times 10^6$ | 280 | 0.9 |
| 3-2 | $1.5 \times 10^7$ | 350 | 0.6 |

*measured while changing the gate voltage (drain voltage $V_D = 10$ V constant)

**calculated from $\sqrt{I_D} - V_G$ dependency

TABLE 7

| | Gas used | Flow rate (SCCM) | Discharge power (W) | Substrate temperature (°C)* | Inner pressure (Torr)* | Light energy source* | Deposition rate (Å/sec.)* | Deposition period (min.)* |
|---|---|---|---|---|---|---|---|---|
| Active species A generation chamber | $SiF_4$ | 30 | 650 | | | | | |
| Active species B generation chamber | $H_2$ | 60 | 300 | 300 | 0.02 | Xe lamp 1 KW | 3 | 30 |
| Condition for introducing H | $H_2$ | 10→0 | — | | | | | |

*in the film forming chamber

TABLE 8

| Sample No. | Profile of the flow rate for $H_2$ gas | $\sigma d$ ($\Omega^{-1} \cdot cm^{-1}$) | Average grain size (μm) | Content of F in a film (atomic ratio) | Localized state density in a film ($cm^{-3} \cdot ev^{-1}$) | IR spectrum ratio (peak in 2000 $cm^{-1}$/ peak in 2100 $cm^{-1}$) |
|---|---|---|---|---|---|---|
| 4-1 | FIG. 5 | $8 \times 10^{-4}$ | 4.5 | 0.05 | $3.5 \times 10^{16}$ | 0.65 |
| 4-2 | FIG. 6 | $5 \times 10^{-4}$ | 3.2 | 0.07 | $4 \times 10^{16}$ | 0.7 |

TABLE 9

| Sample No. | The ratio of the maximum value for drain current to its minimum value* | Field effect mobility** (cm$^2$/v · sec) | Threshold voltage (V) |
|---|---|---|---|
| 5-1 | 7 × 10$^6$ | 250 | 1.2 |
| 5-2 | 4 × 10$^6$ | 180 | 1.5 |

*measured while changing the gate voltage (drain voltage $V_D$ = 10 V constant)
**calculated from $\sqrt{I_D}$ − $V_G$ dependency

TABLE 10

| Sample No. | Profile of the flow rate for F$_2$ gas | Profile of the content of F in a film | Average grain size (μm) | Content of H in a film (atomic ratio) | Localized state density in a film (cm$^{-3}$ · ev$^{-1}$) | σd (Ω$^{-1}$ · cm$^{-1}$) |
|---|---|---|---|---|---|---|
| 6-1 | FIG. 5 | FIG. 11 | 4.2 | 0.04 | 4 × 10$^{16}$ | 6 × 10$^{-4}$ |
| 6-2 | FIG. 6 | FIG. 12 | 4.0 | 0.04 | 4 × 10$^{16}$ | 7 × 10$^{-4}$ |
| 6-3 | FIG. 7 | FIG. 13 | 4.5 | 0.05 | 5 × 10$^{16}$ | 3 × 10$^{-4}$ |
| 6-4 | FIG. 8 | FIG. 14 | 3.7 | 0.045 | 4 × 10$^{16}$ | 5 × 10$^{-4}$ |

TABLE 11

| Sample No. | The ratio of the maximum value for drain current to its minimum value* | Field effect mobility** (cm$^2$/v · sec) | Threshold voltage (V) |
|---|---|---|---|
| 7-1 | 7 × 10$^6$ | 280 | 0.9 |
| 7-2 | 1 × 10$^7$ | 340 | 0.7 |

*measured while changing the gate voltage (drain voltage $V_D$ = 10 V constant)
**calculated from $\sqrt{I_D}$ − $V_G$ dependency

TABLE 12

| | Gas used | Flow rate (SCCM) | Discharge power (W) | Substrate temperature (°C.)* | Inner pressure (Torr)* | Light energy source* | Deposition rate (Å/sec.)* | Deposition period (min.)* |
|---|---|---|---|---|---|---|---|---|
| Active species A generation chamber | SiF$_4$ | 30 | 650 | | | | | |
| Active species B generation chamber | H$_2$ | 60 | 300 | 300 | 0.02 | Xe lamp 1 KW | 3 | 30 |
| Condition for introducing F | F$_2$ | 10→0 | — | | | | | |

*in the film forming chamber

TABLE 13

| Sample No. | Profile of the flow rate for H$_2$ gas | σd (Ω$^{-1}$ · cm$^{-1}$) | Average grain size (μm) | Content of H in a film (atomic ratio) | Localized state density in a film (cm$^{-3}$ · ev$^{-1}$) |
|---|---|---|---|---|---|
| 8-1 | FIG. 5 | 7 × 10$^{-4}$ | 4.7 | 0.05 | 4 × 10$^{16}$ |
| 8-2 | FIG. 6 | 4 × 10$^{-4}$ | 3.0 | 0.07 | 5 × 10$^{16}$ |

TABLE 14

| Sample No. | The ratio of the maximum value for drain current to its minimum value* | Field effect mobility** (cm$^2$/v · sec) | Threshold voltage (V) |
|---|---|---|---|
| 9-1 | 5 × 10$^6$ | 210 | 1.5 |
| 9-2 | 2 × 10$^6$ | 170 | 1.8 |

*measured while changing the gate voltage (drain voltage $V_D$ = 10 V constant)
**calculated from $\sqrt{I_D}$ − $V_G$ dependency

TABLE 15

| Sample No. | The ratio of the maximum value for drain current to its minimum value* | Field effect mobility** (cm$^2$/v · sec) | Threshold voltage (V) |
|---|---|---|---|
| 10-1 | 5 × 10$^6$ | 240 | 1.0 |
| 10-2 | 3 × 10$^6$ | 220 | 1.2 |

*measured while changing the gate voltage (drain voltage $V_D$ = 10 V constant)
**calculated from $\sqrt{I_D}$ − $V_G$ dependency

What we claim is:

1. A field effect thin film transistor comprising a substrate, a gate electrode, an insulating layer, a semiconductor layer, first and second n+ type layers being disposed on said semiconductor layer, a source electrode being disposed on said first n+ type layer and a drain electrode being disposed on said second n+ type layer, characterized in that said semiconductor layer is formed from a polycrystal silicon film with a localized state density of 10$^{17}$ cm$^{-3}$ev$^{-1}$ or less which contains silicon atoms as the matrix, hydrogen atoms at a concentration of 0.1 atomic ratio or less and fluorine atoms at a concentration of 0.05 atomic ratio or less, said concentration of at least one of said hydrogen atoms and said fluorine atoms being enhanced in a region of said semiconductor layer adjacent to said substrate and being reduced in a region of said semiconductor layer on the side opposite the substrate side.

* * * * *